US005286208A

United States Patent [19]

Matsuoka

[11] Patent Number: 5,286,208

[45] Date of Patent: Feb. 15, 1994

[54] CONTACT IN ELECTRIC PART SOCKET

[75] Inventor: Noriyuki Matsuoka, Yokohama, Japan

[73] Assignee: Yamaichi Electric Co., Ltd., Tokyo, Japan

[21] Appl. No.: 831,573

[22] Filed: Feb. 4, 1992

[30] Foreign Application Priority Data

Feb. 19, 1991 [JP] Japan ................................ 3-103656

[51] Int. Cl.[5] ................................ H05K 1/00

[52] U.S. Cl. ................................ 439/72; 439/71; 439/862

[58] Field of Search ................................ 439/68-73, 439/326-328, 861, 862, 842, 851, 330, 331

[56] References Cited

U.S. PATENT DOCUMENTS 4,362,353 12/1982 Cobaugh et al. .................... 439/861
4,370,012 1/1983 Grabbe et al. .................... 439/862
4,959,029 9/1990 Grabbe .................... 439/862
4,995,816 2/1991 Grabbe .................... 439/71
5,100,338 3/1992 Lu .................... 439/326

*Primary Examiner*—David L. Pirlot
*Attorney, Agent, or Firm*—Wenderoth Lind & Ponack

[57] ABSTRACT

A contact of an electric part socket has a first spring portion, a second spring portion spaced apart from the first spring portion but connected to it at both basal and distal ends thereof, a terminal portion leading to the connecting portion between the basal ends and adapted to be brought into contact with a wiring board or the like, and a contact portion formed on the connecting portion between the distal ends and adapted to be brought into contact with a terminal of an electric part to be engaged on it. The first and second spring portions are flexed about the connecting portion between the basal ends in order to displace the contact portion downward. The contact portion is pressure contacted with the terminal of the electric part mounted on it by reaction of the first and second spring portions.

5 Claims, 4 Drawing Sheets

CONTACT IN ELECTRIC PART SOCKET

BACKGROUND OF THE INVENTION

1. Field of the Invention

This invention relates to a contact to be used for contacting with a terminal of an electric part such as an IC package.

2. Description of the Prior Art

A conventional contact 1, as shown in FIG. 9, often used in a socket for an IC, etc. comprises a supporting portion 2 extending in a horizontal direction, a terminal portion 3 extending downward continuously from the supporting portion 2 in order to be contacted with a circuit board or the like, a spring portion 4 disposed above the supporting portion in such a manner as to be continuous therefrom and curved into a horizontal generally U-shape, and a mount contact portion 5 formed on a free end of the spring portion in order to exert a vertical resiliency thereto and adapted to receive thereon an external terminal of an IC, the mount contact portion 5 being displaced downward while flexing the U-shaped spring portion 4 when the terminal of an electric part is contacted thereon and pressure is exerted thereto, so that the mount contact portion 5 is pressure contacted wtih the terminal of the electric part by reaction thereof.

In recent years, with the development of electronics manufacturing techniques, a small size of an IC socket is in demand. Furthermore, miniaturization of the contacts in an IC socket and of an external terminal of an IC has progressed, and as a result, achievement of a reliable contact relation therebetween is increasingly in demand at present. However, the conventional contact of the type in which a terminal of an electric part is contacted thereon in order to obtain an electric contact relation therebetween has such shortcomings that when the horizontal U-shaped spring portion is displaced in a vertical direction against its resiliency in order to exert contact pressure to the contact portion, the contact portion is disconnected from the external terminal of the IC because the contact portion has components which are excessively displaced forward and backward while it is itself displacing downward.

Since the space for accommodating the horizontal generally U-shaped spring portion is limited, even if the configuration of the spring portion is changed in order to reduce the amount of displacement of the contact portion in the forward and backward direction, control of the displacement of the contact portion in the forward and backward direction owing to the change in configuration thereof is necessarily limited.

Also, a conventional IC package called a TAB package has such shortcomings that since an external terminal thereof is a Cu foil which is soft, the strength thereof is very low and when the contact portion of the contact is displaced in an upward or downward direction, it is moved forward and backward while itself being friction contacted with the Cu foil, to thereby cause the weak external terminal to be deformed.

SUMMARY OF THE INVENTION

It is therefore a general object of the present invention to provide a contact in an electric part socket capable of obviating the above-described shortcomings.

A specific object of the present invention is to provide a contact of the type in which a terminal of an electric part such as an IC or the like is engaged with a contact portion formed on a distal end of a spring portion to displace the spring portion downward in order to obtain a contact pressure owing to reaction thereof, wherein displacement of the contact portion is effectively made, and displacing components of the contact portion in a forward and backward direction can be controlled to a necessary range with ease when the contact portion is displaced downward.

To achieve the above objects, a contact in an electric part socket of the present invention includes a first spring portion, a second spring portion spaced from the first spring portion but connected thereto at both basal and distal ends thereof, a terminal portion leading to the portion connected between the basal ends and adapted to be brought into contact with a wiring board or the like, and a contact portion formed on the portion connected between the distal ends and adapted to be brought into contact with a terminal of an electric part to be contacted thereon, said first and second spring portions being flexed about the connecting portion between the basal ends in order to displace the contact portion downward, said contact portion being pressure contacted with the terminal of the electric part contacted thereon by reaction of said first and second spring portions.

With the above construction, when downward force is exerted on the contact portion upon placement of a terminal of an electric part thereon, the first and second spring portions are flexed downward together to cause the contact portion to displace downward, and the contact portion is pressure contacted with the terminal of the electric part connected thereon by reaction of the first and second spring portion.

When the first and second spring portions are flexed downward together or when they are restored upward together, they mutually control a forward or backward movement of the contact portion, so that the contact portion can be displaced downard almost in a vertical direction. Otherwise, by appropriately determining configuration, dimension and arrangement of the first and second spring portions, the amount of displacement of the contact portion in a forward or backward direction can be controlled to a limited range with ease.

According to the present invention, by effectively restraining or removing excessive movements of the contact portion in a forward or backward direction, the problem of a contact portion being disconnected from a minute terminal of an electric part and the problem of a terminal of a TAB package being damaged can be effectively prevented.

DETAILED DESCRIPTION OF THE EMBODIMENTS

Figure 1:
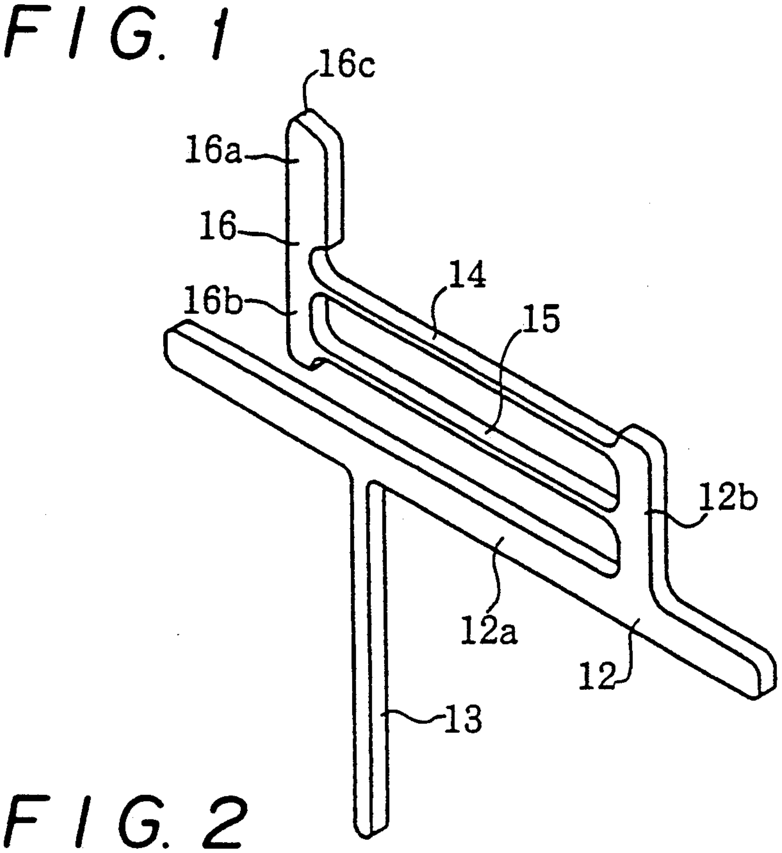
FIG. 1 is a perspective view of a contact according to one embodiment of the present invention.

One embodiment of the present invention will be described with reference to FIGS. 1–3 inclusive.

The numeral 11 denotes a contact to be embedded in an electric part socket. The contact 11 has an inverse T-shaped supporting portion formed of a supporting portion 12*a* extending in a lateral direction and a basal end connecting portion constituted by a vertical supporting portion 12*b* rising from portion 12*a*. Preferably, the lateral supporting portion 12*a* is extended in a generally horizontal direction, and the vertical supporting portion 12*b* rises in a generally vertical direction from a position offset toward a rear end of the lateral supporting portion 12*a*. The supporting portion 12 has a first linear spring portion 14 and a second linear spring portion 15 connected thereto and extending in a lateral direction in an equal length from the vertical supporting portion 12*b*. Accordingly, the first and second spring portions 14 and 15 are located in a higher position than the horizontal supporting portion 12*a*, and the first spring portion 14 is located in a higher position than the second spring portion 15 and spaced apart from and preferably in parallel relation to the second spring portion 15.

The basal ends of the first and second spring portions 14 and 15 are interconnected by the basal end connecting portion constituted by vertical supporting portion 12*b*, and the distal ends thereof are interconnected by the contact portion 16. Accordingly, the vertical supporting portion 12*b* of the supporting portion 12 forms a connecting portion between the basal ends of the first and second spring portions, and the contact portion 16 forms a connecting portion between the distal ends of the first and second spring sections.

On the one hand, the contact portion 16 interconnects the first and second spring portions 14 and 15, and on the other hand, it is extended in the vertical direction, an upper end thereof projecting upward from the front end of the first spring portion 14 to form a contact end portion 16*a*, an end face of the contact end portion 16*a* serving as a contact point 16*c* with respect to a terminal of an electric part to be contacted thereon. Accordingly, the contact portion 16 has at its lower part a distal end connecting portion 16*b* for interconnecting the first and second spring portions 14 and 15, and at its upper part the contact end portion 16*a*.

The first and second spring portions 14 and 15 are so designed in a configuration of a spring and in sectional configuration that resiliency of the first and second spring portions 14 and 15 is equal. Further the orientation of the contact supporting portion 12 with respect to the vertical supporting portion 12*b* and with a median line m therebetween is identical with the orientation of the contact supporting portion 12 with respect to the contact portion 16. A terminal portion 13 extends downward from the lateral supporting portion 12*a* in order to be contacted with a wiring board or the like.

Figure 3:
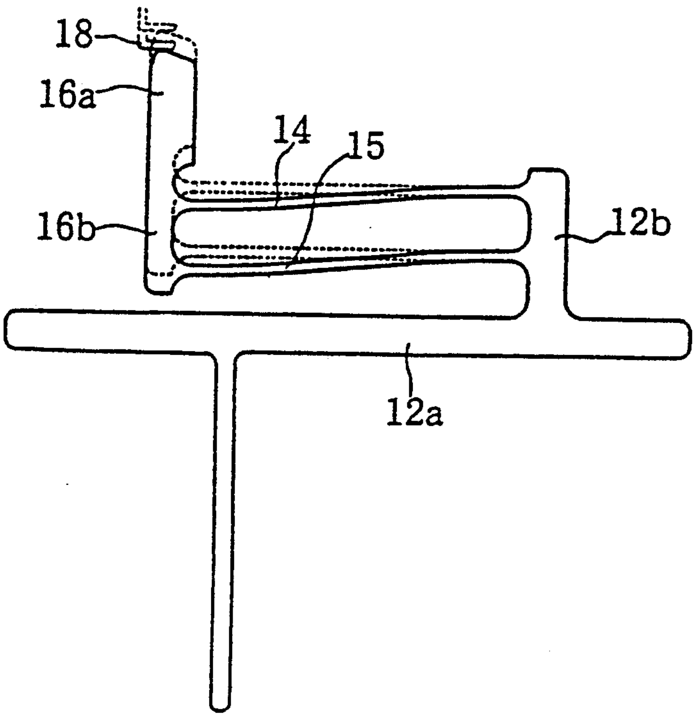
FIG. 3 is a side view showing the contact of FIG. 1 in a displaced state.

As is shown in FIG. 3, when a terminal 18 of an electric part is contacted on the contact point 16*c* and pressure is exerted on the contact point 16*c* from above, the first and second spring portions 14 and 15 are displaced from the positions shown by the broken lines to the positions shown by the full lines against resilience thereof. Reaction of the first and second spring portions 14 and 15 exerts contacing force directed upward to the contact portion 16, i.e. contact point 16*c* so that the contact point 16*c* is pressure contacted with the terminal 18.

If the spring constants of the first and second spring portions 14 and 15 are equal at the time and the above displacement is given, the connecting portion of the first and second spring portions 14 and 15 having the contact portion 16 therein is displaced in the same direction by an equal distance with respect to the connecting portion constituted by the vertical supporting portion 12*b*. As a result, the contact portion 16 is displaced almost in a vertical direction, along a connecting line c perpendicular to the median line m, and displacing components of the first and second spring portions 14 and 15 in a forward and backward direction, i.e. sideways in FIG. 3, are removed or minimized.

Figure 4:
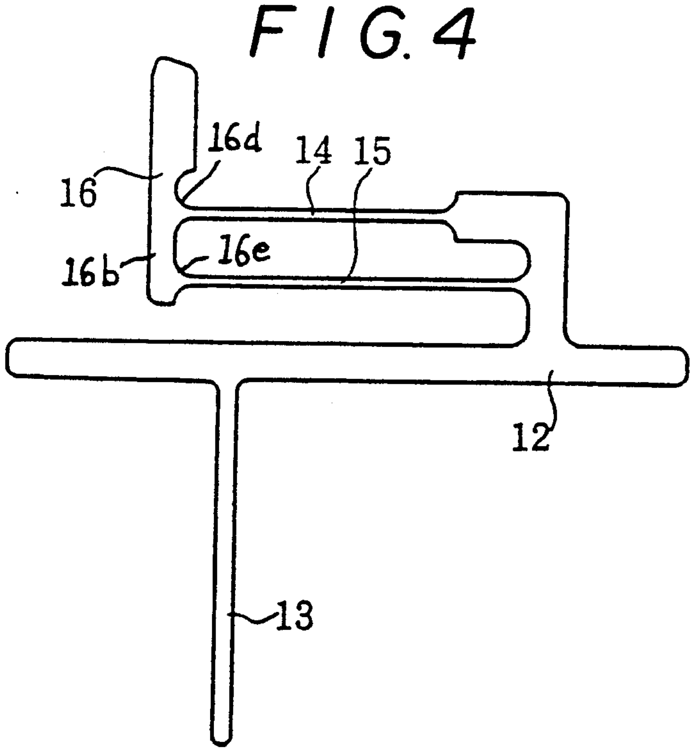
FIG. 4 is a side view of a contact according to another embodiment of the present invention.
Figure 5:
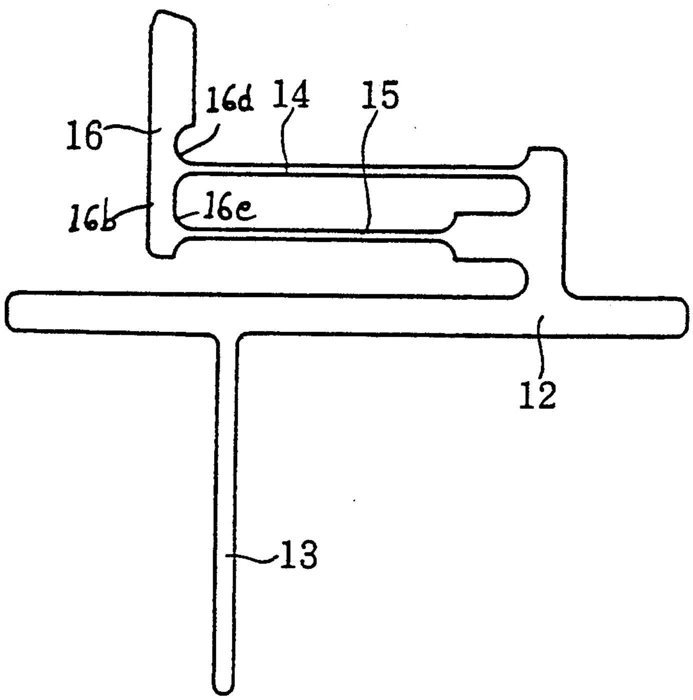
FIG. 5 is a side view of a contact according to a further embodiment of the present invention.

FIGS. 4 and 5 show other embodiments. In FIG. 4, the first spring portion 14 is shorter than the second spring portion 15. As a result, upon downward displacement of the contact point 16*c* of the contact portion 16, the connecting points 16*d* and 16*c* of the first and second spring portions 14 and 15 with the distal end connecting portion 16*b* having the contact portion 16 thereon is displaced in a different direction by a different distance. Actually, the connecting point 16*d* of the first spring portion 14 to the connecting portion 16*b* is displaced backward, i.e. to the right in FIG. 4, by a greater amount than the connecting point 16*c* of the second spring portion 15 to the connecting portion 16*b*. This means that the contact portion 16 is displaced downward and with a backward displacing component. As a result, the contact point 16*c* is displaced backward by a limited dimension at the same time the contact point 16*c* is being displaced downward. The amount of this backward displacement can be made to be a value within a range of, for exmple, an area of the terminal of an electric part by appropriately setting the lengths of the first and second spring portions.

In FIG. 5, the first spring portion 14 is longer than the second spring portion 15. As a result, upon downward displacement of the contact point 16*c* of the contact portion 16, the connecting points 16*d* and 16*e* of the first and second spring portions 14 and 15 to the connecting portion 16*b* are displaced by a different distance in a different direction. Actually, the contacting points 16*e* of the second spring portion 15 to the connecting portion 16*b* is displaced backward by a greater degree than the connecting point 16*d* of the first spring portion 14 to the connecting portion 16*b*. This means that the contact portion 16 is displaced downward and with a forward displacing component. As a result, the contact point 16*c* is displaced forward by a limited dimension at the same time the contact point 16*c* is being displaced downward. The amount of this forward displacement can be restricted to a necessary minimum by selecting a proper difference in length between the first and second spring portions. In the embodiments shown in FIGS. 4 and 5, an excessive displacement of the contact point 16*c* in the forward and backward direction can be avoided, and the amount of displacement of the contact point 16*c* in the forward and backward direction, which is required for friction with the terminal 18 as mentioned above, can be controlled by selecting the above lengths.

In addition to the above, by changing various factors which exert an effect on the resiliency of the first and second spring portions 14 and 15, such as sectional configurations, positional relation, material, length, etc. of the first and second spring portions 14 and 15 which are not shown, an intended downward displacement can be obtained while freely controlling displacing components of the contact point 16c, such as a forward displacement, a backward displacement and the like, without increasing the size of a contact, that is, without increasing the size of a socket.

Figure 6:
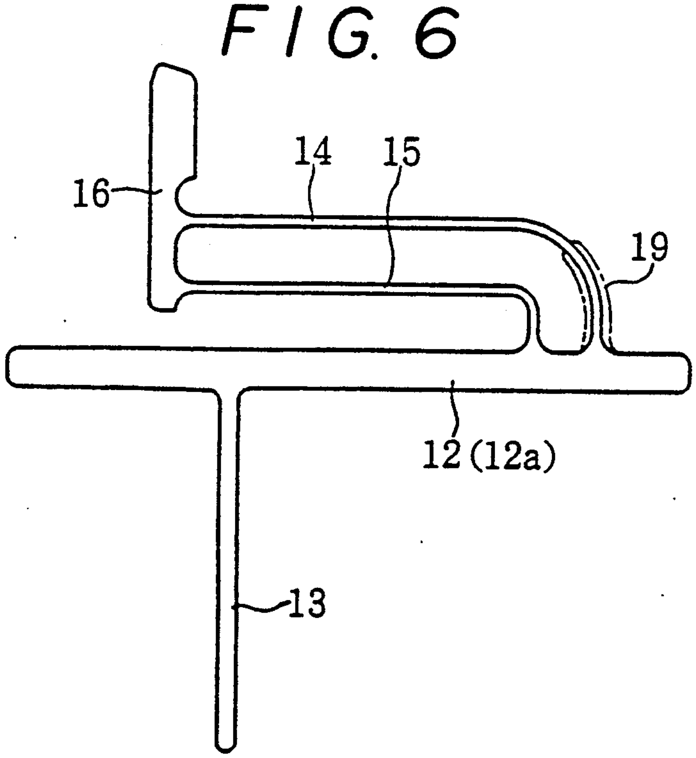
FIG. 6 is a side view of a contact according to a still further embodiment of the present invention.

FIG. 6 shows a further embodiment, in which the supporting portion 12 of the contact 11 is not provided with the vertical supporting portion 12b, and the basal ends of the first and second spring portions 14 and 15 are connected to an end part of the lateral supporting portion 12a which end part constitutes the basal end connecting portion. In this arrangement, the first spring portion 14, which is located in a higher position, may be provided at a basal end portion thereof with a supporting piece 19 having high rigidity as shown by chain lines in FIG. 6 in order to make the spring lengths of the first and second spring portions 14 and 15 as equal as possible. The first and second spring portions 14 and 15 have a curved portion at basal end portions thereof, respectively, and are connected to the lateral supporting portion 12a through this curved portion.

Figure 7:
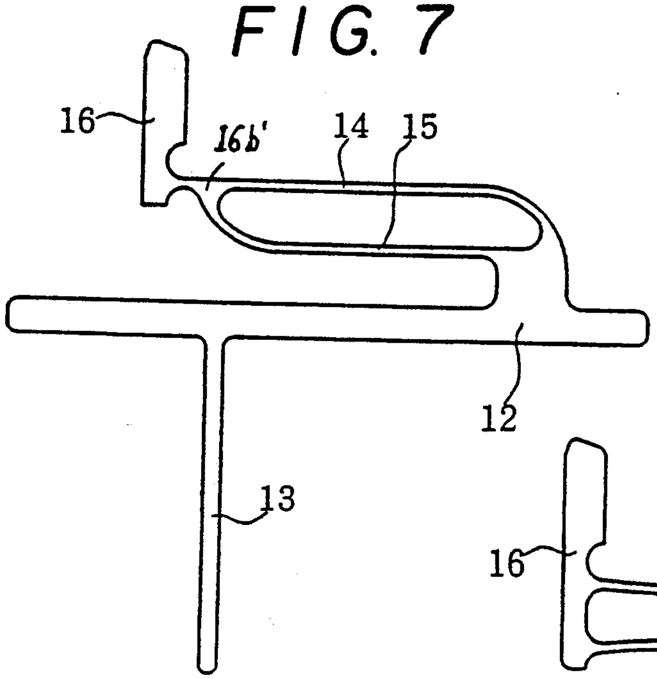
FIG. 7 is a side view of a contact according to yet another embodiment of the present invention.

FIG. 7 shows a still further embodiment, in which the first and second spring portions 14 and 15 are interconnected at distal end portions thereof by a distal end connecting portion 16b' which in turn is connected to the contact portion 16 at a single point.

Figure 8:
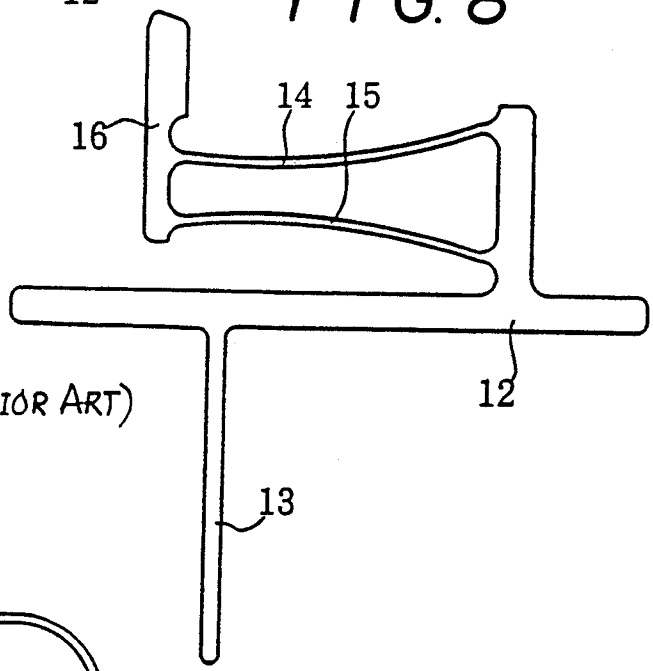
FIG. 8 is a side view of a contact according to an additional embodiment of the present invention.
Figure 9:
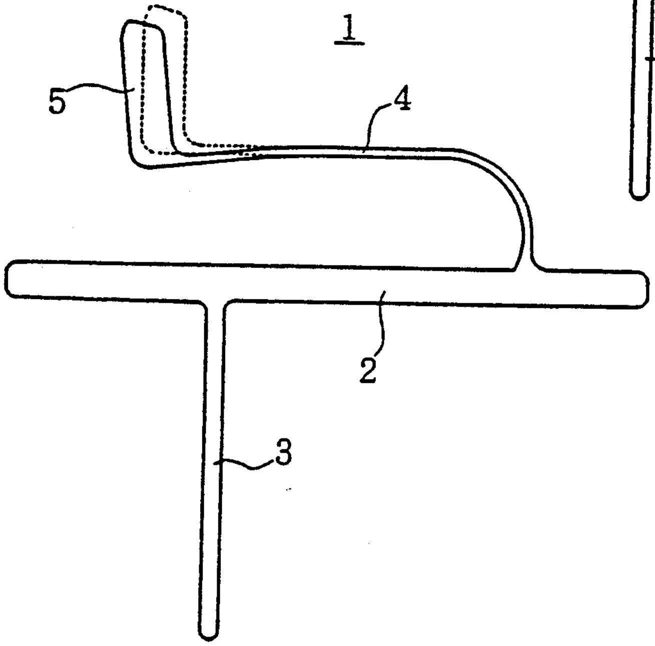
FIG. 9 (PRIOR ART)
FIG. 9 is a side view of a conventional contact.

FIG. 8 shows a still further embodiment of the present invention, in which the first and second spring portions 14 and 15 are curved in opposite directions with respect to each other so that they exhibit a convex curve respectively and are extended in a lateral direction. This embodiment also contemplates a construction wherein only one of the spring portions 14 and 15 is curved. As suggested in this embodiment, the first and second spring portions 14 and 15 may have various other shapes than the curved shape between the connecting portion at the basal end portions thereof and the connecting portion at the distal end portions thereof.

Figure 2:
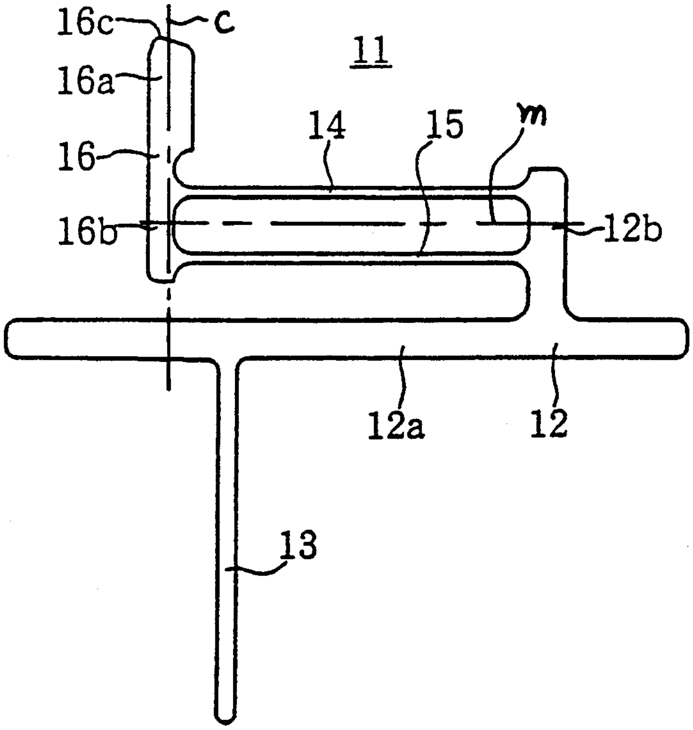
FIG. 2 is a side view of the contact of FIG. 1.

The present invention includes the embodiments shown in FIGS. 4-8 in addition to the embodiments shown in FIGS. 1-3 and also includes other modified embodiments of a contact type contact suggested by these embodiments.

As described above, a contact in an electric part socket according to the present invention includes a first spring portion, a second spring portion spaced apart from the first spring portion but connected thereto at both basal and distal ends thereof, a terminal portion leading to the connecting portion between the basal ends and adapted to be brought into contact with a wiring board or the like, and a contact portion formed on the connecting portion between the distal ends and adapted to be brought into contact with a terminal of an electric part to be engaged thereon, said first and second spring portions being flexed about the connecting portion between the basal ends in order to displace the contact portion downward, said contact portion being pressure contacted with the terminal of the electric part engaged thereon by reaction of said first and second spring portions. Accordingly, since the first and second spring portions mutually control a forward or backward movement when they are flexed downward together or when they are restored upward together, the contact portion can be displaced downward almost in a vertical direction. Otherwise, by making a difference in length, width, etc. of the first and second spring portions, an amount of displacement thereof in a forward or backward direction can be controlled so as to be in a limited range with ease. That is, be effectively restraining or removing excessive displaced components of the contact portion in a forward of backward direction, the problem of a contact portion being disconnected from a minute terminal of an electric part and the problem of a terminal of a TAB package being damaged can be effectively prevented.

According to the present invention, displacement of a contact point can be freely controlled without increasing the size of a socket, and as a result, it becomes easy to design a contact which is hardly displaced with respect to an external terminal of a miniaturized IC.

Furthermore, since displacement of the contact point in a forward and backward direction can be controlled, the amount of displacement of the contact point can be limited to a necessary range. As a result, by effecting a wiping action in order to obtain a stable electric contact relation, oxide coatings of the contact point and external termincal of IC can be wiped off with ease.

What is claimed is:

1. A contact for use in a socket for receiving an electric part, said contact comprising:

a first spring portion;

a second spring portion spaced apart from said first spring portion;

a basal end connecting portion connected between basal ends of said spring portions:

a distal end connecting portion connected between distal ends of said spring portions and extending along a connecting line perpendicular to a median line between said spring portions;

a terminal portion connected to the basal end connection portion and adapted to be brought into contact with a wiring board or the like; and a contact end portion on said distal end connecting portion and extending from said distal end connecting portion in the direction of said connecting line and perpendicular to said median line and having a contact point on the free end thereof spaced from said distal end connecting portion in the direction of said connecting line and adapted to be contacted by a terminal of an electric part inserted into the socket for moving said contact end portion substantially in the direction of said connecting line toward said distal end connecting portion for distorting said first and second spring portions and completing electrical contact between said contact point and the terminal under the resiliency of the distorted first and second spring portions, whereby said contact point moves substantially parallel to said connecting line.

2. A contact as claimed in claim 1 in which said first and second spring portions are curved in opposite directions from each other.

3. A contact as claimed in claim 1 in which said first and second spring portions are in a generally parallel relation.

4. A contact as claimed in claim 1 or 3 in which said first and second spring portions are substantially the same in length.

5. A contact for use in a socket for receiving an electric part, said contact comprising:

a first spring portion;

a second spring portion spaced apart from said first spring portion and having a different length from said first spring portion;

a basal end connecting portion connected between basal ends of said spring portions;

a distal end connecting portion connected between distal ends of said spring portions and extending along a connecting line perpendicular to a median line between said spring portions;

a terminal portion connected to the basal end connection portion and adapted to be brought into contact with a wiring board or the like; and a contact end portion on said distal end connecting portion and extending from said distal end connecting portion in the direction of said connecting line and perpendicular to said median line and having a contact point on the free end thereof spaced from said distal end connecting portion in the direction of said connecting line and adapted to be contacted by a terminal of an electric part inserted into the socket for moving said contact end portion substantially in the direction of said connecting line toward said distal end connecting portion for distorting said first and second spring portions and completing electrical contact between said contact point and the terminal under the resiliency of the distorted first and second spring portions, and for also moving said contact point with a component of motion in a direction laterally of said connecting line.

* * * * *